(12) United States Patent
Kim

(10) Patent No.: US 6,479,336 B2
(45) Date of Patent: Nov. 12, 2002

(54) METHOD FOR FABRICATING SEMICONDUCTOR DEVICE

(75) Inventor: Tae Kyun Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/885,129

(22) Filed: Jun. 21, 2001

(65) Prior Publication Data

US 2002/0001892 A1 Jan. 3, 2002

(30) Foreign Application Priority Data

Jun. 21, 2000 (KR) .............................. 00-34320

(51) Int. Cl.[7] ..................... H01L 21/336; H01L 21/8234
(52) U.S. Cl. ........................................ 438/197; 438/216
(58) Field of Search ................................ 438/197, 216, 438/426, 585, 627, 633, 697, 778, 289

(56) References Cited

U.S. PATENT DOCUMENTS

| 5,591,672 | A | * | 1/1997 | Lee et al. |
| 5,654,216 | A | * | 8/1997 | Adrian |
| 5,688,706 | A | * | 11/1997 | Tseng |
| 5,943,596 | A | * | 8/1999 | Gardner et al. |

* cited by examiner

Primary Examiner—David Nelms
Assistant Examiner—Phuc T. Dang
(74) Attorney, Agent, or Firm—Birch, Stewart, Kolasch & Birch, LLP

(57) ABSTRACT

In the method of fabrication a structure is formed on a semiconductor substrate. The structure includes a tungsten suicide film. A contact hole is formed in the structure, and an oxidation process is conducted such that if a portion of the tungsten silicide film is exposed by the contact hole, a silicon oxide film is formed on the exposed portion of the tungsten silicide film.

16 Claims, 7 Drawing Sheets

METHOD FOR FABRICATING SEMICONDUCTOR DEVICE

This nonprovisional application incorporates by reference the subject matter of Application No. 2000-34320 filed in Korea on Jun. 21, 2000, on which a priority claim is based under 35 U.S.C. §119(a).

BACKGROUND OF THE INVENTION

1. Field of the Invention

The present invention relates to a method for fabricating a semiconductor device, and more particularly to a method for fabricating a semiconductor device having a tungsten gate capable of being applied to a self-aligned contact process.

2. Description of the Related Art

As is well-known, gates are mainly made of polysilicon. This is because the polysilicon sufficiently meets desired properties required for gates, for example, high melting point, easy formation of thin films, easy patterning of lines, stability in an oxidation atmosphere, and formation of planarized surfaces. Where such polysilicon gates are practically applied to MOSFET devices, they obtain a desired resistance value by containing a dopant such as phosphorous (P), arsenic (As), or boron (B).

Meanwhile, an increased degree of integration for semiconductor devices results in a reduction in the value of a parameter, such as the line width of gates, the thickness of gate insulating films, or the junction depth in those semiconductor devices. For this reason, where highly integrated semiconductor devices are fabricated using polysilicon, it is difficult to realize the low resistance required in association with a micro line width. Thus, it is required to develop gates made of a new material substituted for polysilicon.

At the early stage of this development, active research and development efforts have been made in association with polycide gates made of a transition metal-silicide material.

However, such polycide gates have a limitation in realizing a low resistance due to the fact that polysilicon still remains in those gates. To this end, active research and development have recently been made in association with metal gates. Where such a metal gate is made of a metal having a work function value corresponding to the mid band-gap of silicon, it can be fabricated into a single gate usable for both the NMOS type and the PMOS type. The metal having a work function value corresponding to the mid band-gap of silicon may include tungsten (W), tungsten nitride (WN), titanium (Ti), titanium nitride (TiN), molybdenum (MO), tantalum (Ta), and tantalum nitride (TaN).

Where such a metal gate is practically applied to MOSFET devices, however, it has problems involved in the progression of processes, such as difficulty in etching a metal gate, damage applied to an associated silicon substrate during the etching process and thermal damage resulting from [a] thermal process conducted following the process.

For this reason, it is difficult to form such a metal gate using conventional gate formation processes. To this end, a method has been proposed in which metal gates are formed using a damascene process mainly used in the formation of metal lines.

Since this metal gate formation method using a damascene process does not involve an etching process, there is no damage generated in a silicon substrate, and a conventional MOSFET process can be used.

Now, a conventional method for fabricating MOSFET device having a tungsten gate using a damascene process will be described in conjunction with FIGS. 1A to 1E.

Referring to FIG. 1A, a silicon substrate 1 provided with field oxide films 2 defining an active region is first prepared. A first thermal oxide film 3 is formed on the silicon substrate 1 to cover the active region and then a polysilicon film 4 and a hard mask film 5 are sequentially deposited over the field oxide film 2 and the first thermal oxide film 3.

Referring to FIG. 1B, a hard mask pattern 5a defining a gate formation region is formed by patterning the hard mask film 5 in accordance with a well-known photolithography process. A polysilicon film 4 and a first thermal oxide film 3 are etched using the hard mask pattern 5a as an etch mask, as a result, a sacrificial gate 4a is formed. The resultant structure is subjected to a gate re-oxidation process, thereby forming a second thermal oxide film 6 on side walls of the sacrificial gate 4a and the exposed surface of the silicon substrate 1. Subsequently, impurity ions having a desired conductivity are implanted at a low concentration into portions of the silicon substrate 1, respectively arranged at opposite sides of the sacrificial gate 4a via the second thermal oxide film 6. As a result, lightly doped drain LDD regions 7 are formed.

Referring to FIG. 1C, the second thermal oxide film is removed. A spacer 8 is formed on side walls of the sacrificial gate 4a and the hard mask pattern 5a. Impurity ions having a desired conductivity are implanted, at a high concentration into the silicon substrate 1, thereby forming source/drain regions 9 on portions of the silicon substrate, respectively arranged at opposite sides of the sacrificial gate 4a, including the spacer 8.

Referring to FIG. 1D, a interlayer insulating film 10 is deposited over the resultant substrate and thereafter, the interlayer insulating film 10 and the hard mask pattern 5a are polished in accordance with a CMP process using the sacrificial gate 4a as a polishing stop layer. The exposed sacrificial gate and the first thermal oxide film are removed to form a groove defining a region where a metal gate is to be formed. A gate insulating film 11 is formed to have a uniform thickness. Subsequently a metal film, for example a tungsten film 12 is deposited to completely film the groove.

Referring to FIG. 1E, a tungsten gate 12a is formed by polishing the tungsten film 12 and the gate insulating film 11 in accordance with a CMP process using the interlayer insulating film 10 as a polishing stop layer. Thus a MOSFET device having the tungsten gate 12a is obtained.

The tungsten gate 12a is capable of realizing a low resistance in association with a macro line width, and therefore it can be advantageously applied to fabricating highly-integrated devices.

However, it is difficult to apply the self aligned contact (SAC) process in a MOSFET device having the tungsten gate 12a due to the fact that there is no barrier film for the SAC process. For example, where there is a misalignment of a light exposure mask used, as shown in FIG. 2, an electric short circuit may occur between the tungsten gate 12a and the contact plug 15. As a result, the MOSFET device has degraded reliability and degraded characteristics. Accordingly, it is difficult for the MOSFET device having the tungsten gate to be subjected to a SAC process. In FIG. 2, the reference numeral 14 denotes an insulating film.

As shown in FIG. 3, the electrical short circuit between the tungsten gate 12a and the contact plug 15, is conventionally prevented by forming an SAC barrier film 13 made of a nitride film or a tungsten oxide film on the tungsten gate 12a. Here, The SAC barrier film 13 is obtained by sequentially following the steps of etching the tungsten gate, depositing a nitride film, and polishing the nitride film. The SAC barrier film made of the tungsten oxide film is formed by oxidizing the surface of the tungsten gate to a desired thickness.

However, the formation of the SAC barrier film made of nitride film results in an increase in the manufacturing time and cost of the MOSFET device because it necessarily involves additional processes. Consequently, there is a degradation in productivity, and as a result, it is difficult to practically apply this technique.

The formation of SAC barrier film made of the tungsten oxide film is comparatively simple. However, research efforts for reaction mechanisms and electrical characteristics are only at an early stage, so it is not preferable to use this film at the present time. Moreover, where the oxidation process of tungsten is carried out by furnace annealing, rapid thermal oxidation, $N_2O$ process or $O_2$ plasma process, even the effects on the formation of the tungsten oxide film and its resulting properties are not entirely understood.

As a result, unless that a new method for formatting a SAC barrier film on the tungsten gate is proposed, it is not preferable to apply a SAC process to a MOSFET device having a tungsten gate.

SUMMARY OF THE INVENTION

Therefore, an object of the invention is to provide a method for fabricating a semiconductor device having a tungsten gate capable of having a SAC process applied thereto.

In accordance with the present invention, these and other objects are accomplished by providing a method for fabricating a MOSFET device comprising the steps of: forming a sacrificial gate on an active region of a silicon substrate; forming a source/drain region on the active regions of the silicon substrate at sides of the sacrificial gate; forming a first interlayer insulating film on the silicon substrate while exposing the sacrificial gate; removing the exposed sacrificial gate to form a groove; forming a gate insulating film and a tungsten film over the silicon substrate; polishing the tungsten film and the gate insulating film to form a tungsten gate in the groove; forming a polysilicon film over the resultant substrate including the tungsten gate; forming a tungsten silicide film self-aligned at an interface between the polysilicon film and tungsten gate; polishing the polysilicon film and the tungsten silicide to expose the first interlayer insulating film; forming a second interlayer insulating film over the silicon substrate; forming a contact hole exposing the source/drain region by etching a predetermined parts of the first and second interlayer insulating films; conducting of oxidization process such that if a portion of the tungsten silicide film is exposed, a silicon oxide film is formed on the exposed portion; and forming a contact plug within the contact hole.

These and other objects are also achieved by a method of fabrication, comprising: forming a structure on a semiconductor substrate, the structure including a tungsten silicide film; forming a contact hole in the structure; conducting an oxidation process such that if a portion of the tungsten silicide film is exposed by the contact hole, a silicon oxide film is formed on the exposed portion of the tungsten silicide film.

These objects are further achieved by a semiconductor device, comprising: a tungsten silicide film formed over a semiconductor substrate; a silicon oxide film formed over only a portion of the tungsten silicide film; and an insulating layer formed over the tungsten silicide film not covered by the silicon oxide film.

BRIEF DESCRIPTION OF THE DRAWINGS

These objects, and other features and advantages of the present invention will become more apparent after reading the following detailed description when taken in conjunction with the drawings, in which.

DETAILED DESCRPTION OF THE INVENTION

Figure 1A:
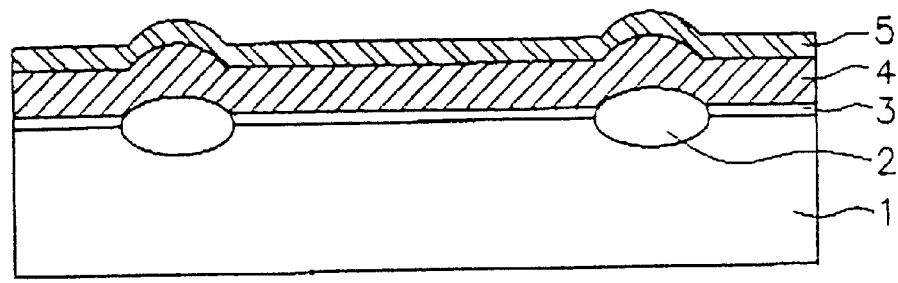
FIGS. 1A to 1E are cross-sectional views respectively illustrating a conventional method for forming a tungsten gate using a damascene process.
Figure 1B:
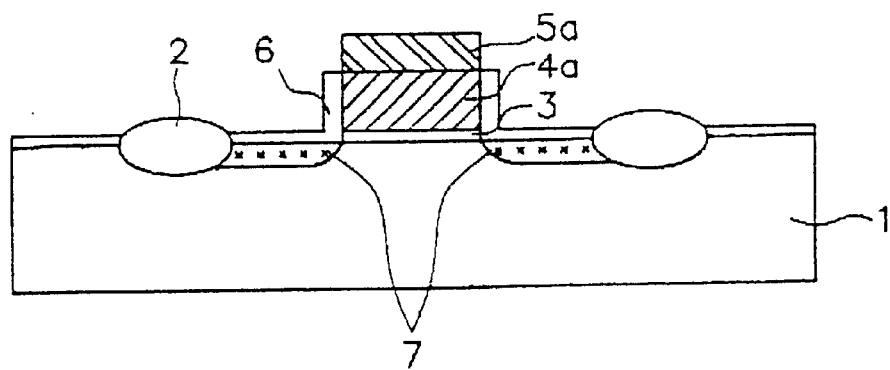
Figure 1C:
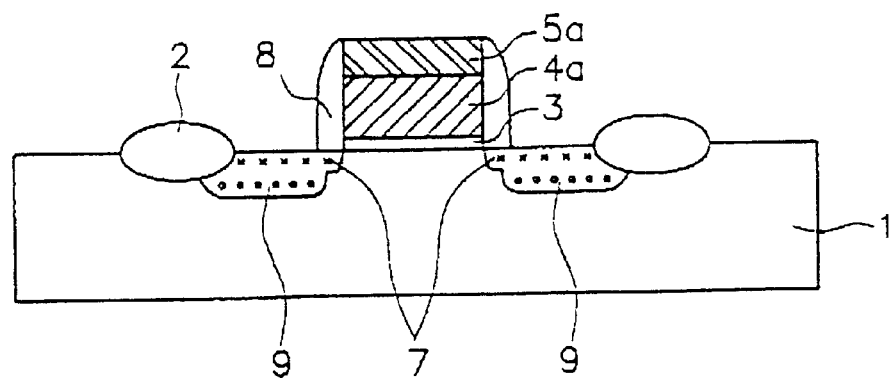
Figure 1D:
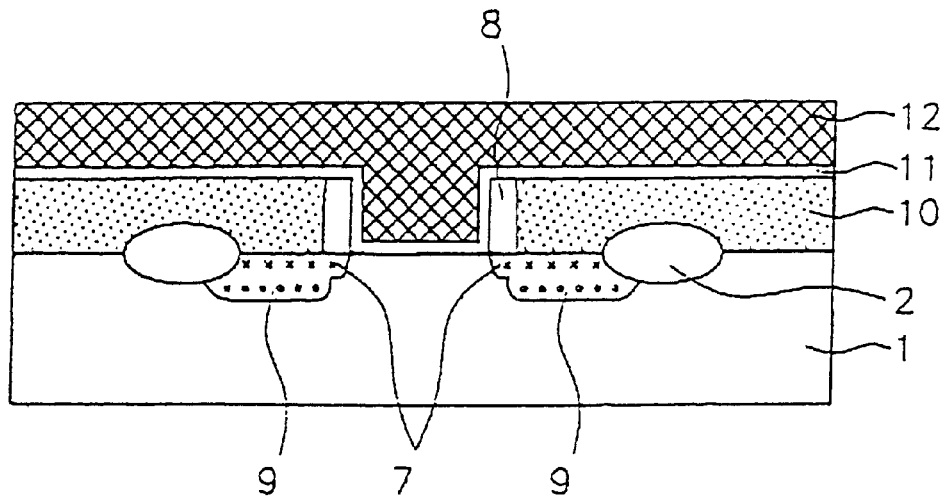
Figure 1E:
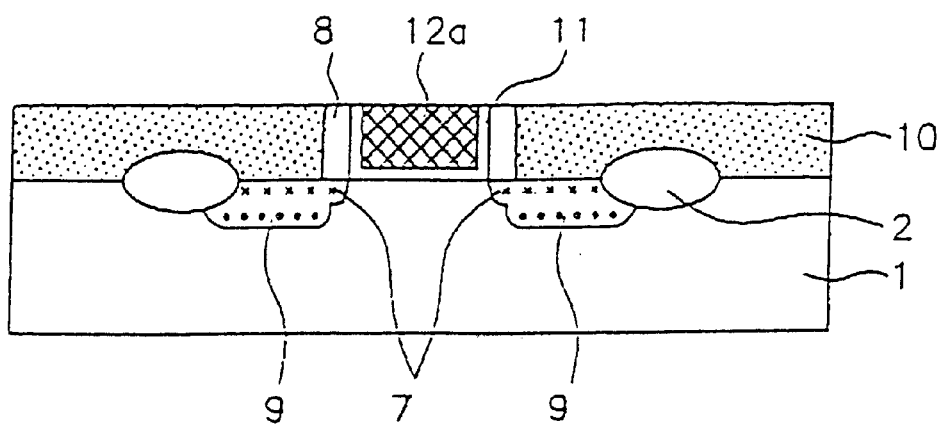
Figure 2:
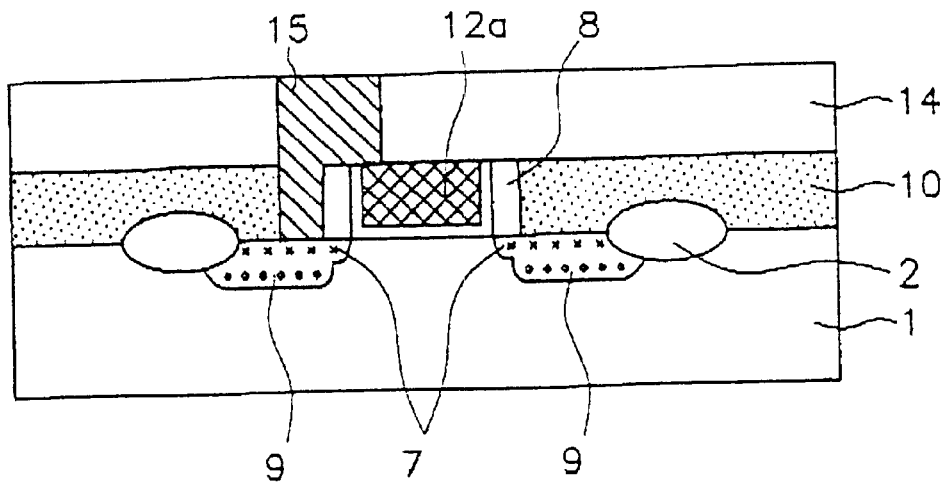
FIGS. 2 and 3 are cross-sectional views respectively illustrating problems involved in a MOSFET device having a conventional tungsten gate.
Figure 3:
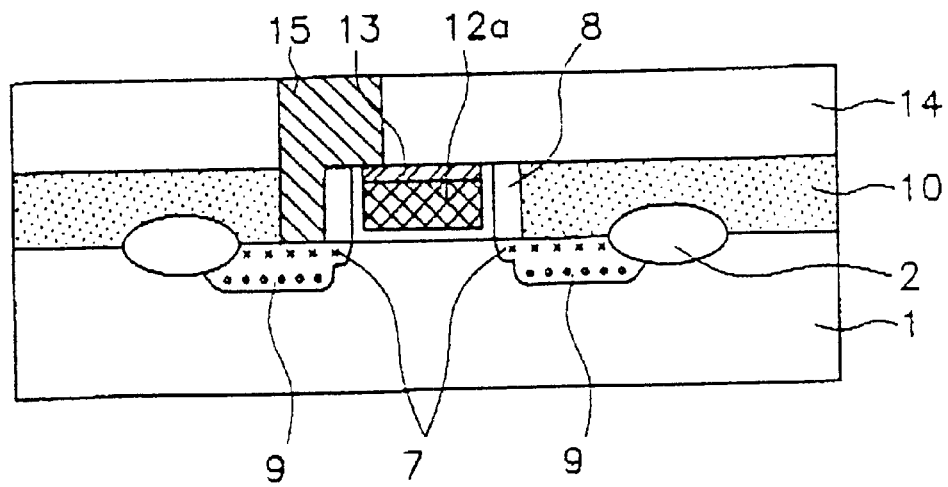
Figure 4A:
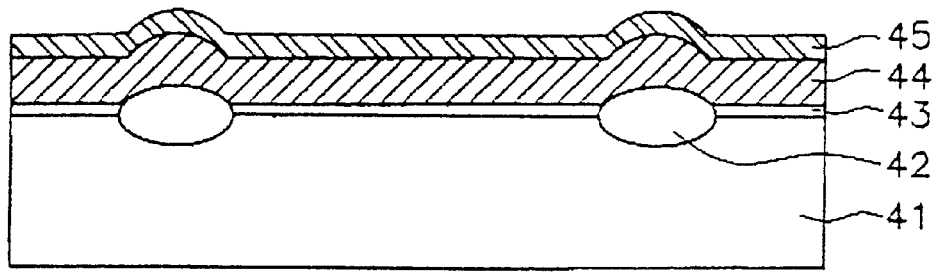
FIGS. 4A to 4I are cross-sectional views respectively illustrating a method for fabricating a MOSFET device in accordance with a preferred embodiment of the present invention.

Referring to FIG. 4A, a silicon substrate 41 provided with field oxide films 42, defining an active region, is first prepared. A first thermal oxide film 43 is formed on the silicon substrate 41 by a thermal oxidation process to cover the active region. A first polysilicon film 44 is deposited to a thickness of 2,000 to 4,000 Å over the first thermal oxide film 43 and field oxide film 42 in accordance with a LP-CVD process. The first polysilicon film 44 is doped with a dopant. The doping of the dopant may be achieved in an in-situ fashion during the deposition. Alternatively, the dopant may be doped in accordance with an ion implantation process after the deposition of the first polysilicon film 44. A hard mask film 45 made of nitride film or oxide film is deposited to a thickness of 800~1,000 Å over the first polysilicon film 44.

Figure 4B:
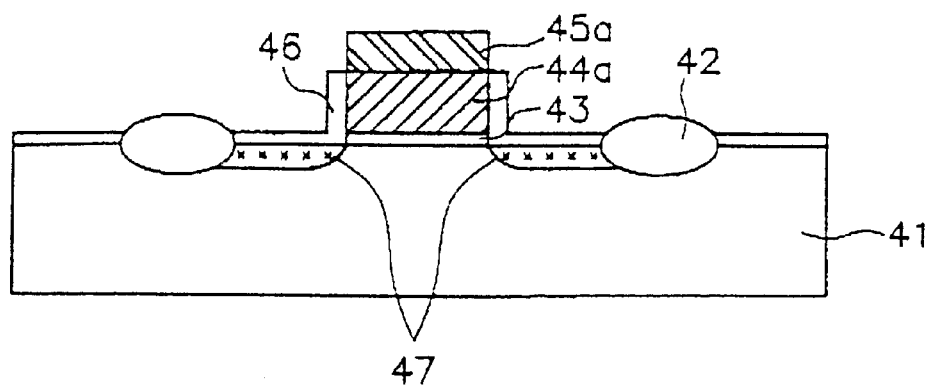

Referring to FIG. 4B, a hard mask pattern 45a is formed by patterning the hard mask film 45 in accordance with a well-known photolithography process. The first polysilicon film 44 and the first thermal oxide film 43 are etched in accordance with an etching process using the hard mask pattern 45a as a mask. As a result, a sacrificial gate 44a is formed over the silicon substrate 41 to cover the active region. The resultant substrate is subjected to a gate re-oxidation process. This gate re-oxidation process is adapted to remove damage generated in the silicon substrate 41 during the above-described etch process for forming the sacrificial gate 44a and prevents damage from occurring in the silicon substrate 41 during a subsequent ion implantation process for forming source/drain regions. After completion of the gate re-oxidation process, a second thermal oxide film 46 is formed to a thickness of 30–100 Å on side walls of the sacrificial gate 44a and the portion of the silicon substrate 41 corresponding to the active region. Subsequently, impurity ions having a desired conductivity are implanted at a low concentration into portions of the silicon substrate, arranged at opposite sides of the sacrificial gate. 45a, respectively. As a result, lightly doped drain (LDD) regions 47 are formed.

Figure 4C:
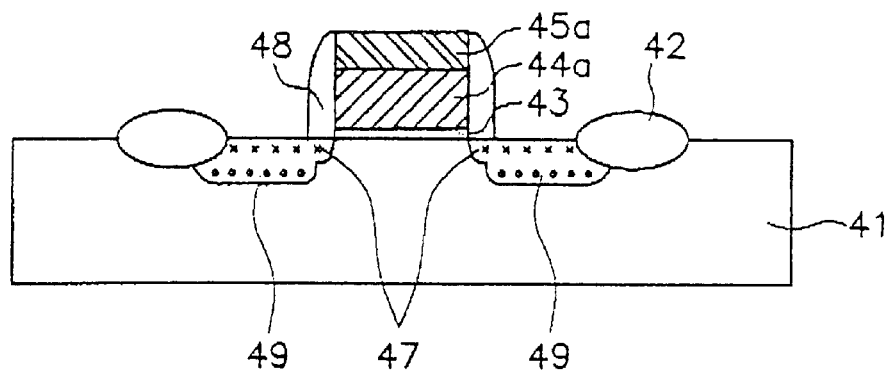

Referring to FIG. 4C, the second thermal oxide film is then removed. An oxide film is deposited to a thickness of 900 to 1,200 Å over the entire resultant structure obtained after the removal of the second thermal oxide film. Thereafter, a spacer 48 is formed on side walls of the hard mask pattern 45a and the sacrificial gate 44a by blanket etching the oxide film. Impurity ions having a desired conductivity are implanted at a high concentration, thereby forming source/drain regions 49 on the exposed silicon substrate to cover the active region.

Figure 4D:
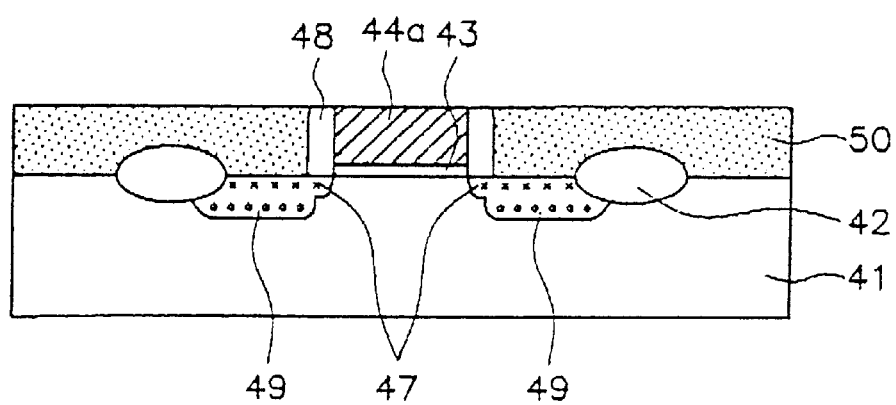

Referring to FIG. 4D, an interlayer insulating film 50 is deposited to a thickness of 4,000 to 6,000 Å over the resultant substrate obtained after completion of the processing steps shown in FIG. 4C. Thereafter, the interlayer insulating film 50 and the hard mask pattern 45a are polished in accordance with a CMP process using the sacrificial gate 44a as a polishing stop layer. As a result, the interlayer insulating film 50 is planarized and the sacrificial gate 44a is exposed.

Figure 4E:
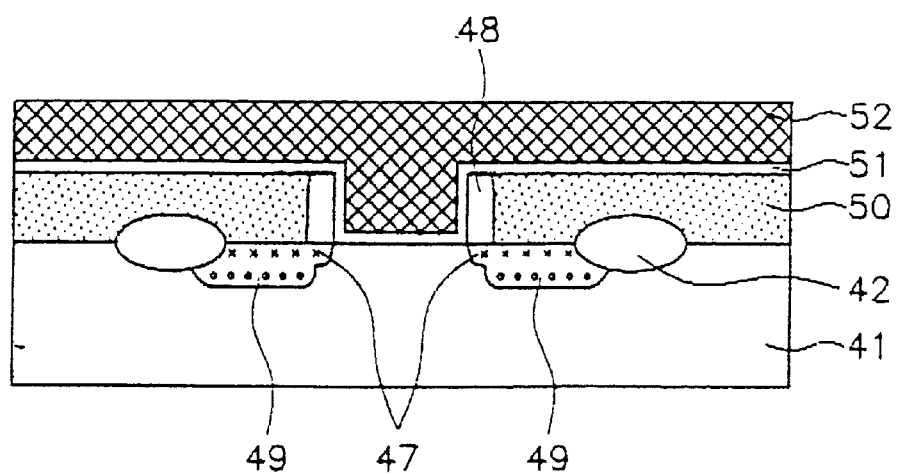

Referring to FIG. 4E, the exposed sacrificial gate 44a and the first thermal oxide film 43 disposed beneath the sacrificial gate 44a are then removed in accordance with a dry or wet etching process. A gate insulating film 51 is formed to have a uniform thickness over the resultant substrate and subsequently, a tungsten film 52 is deposited over the gate insulating film 51. The tungsten film 52 is formed in accordance with a physical vapor deposition process or a chemical vapor deposition process.

Figure 4F:
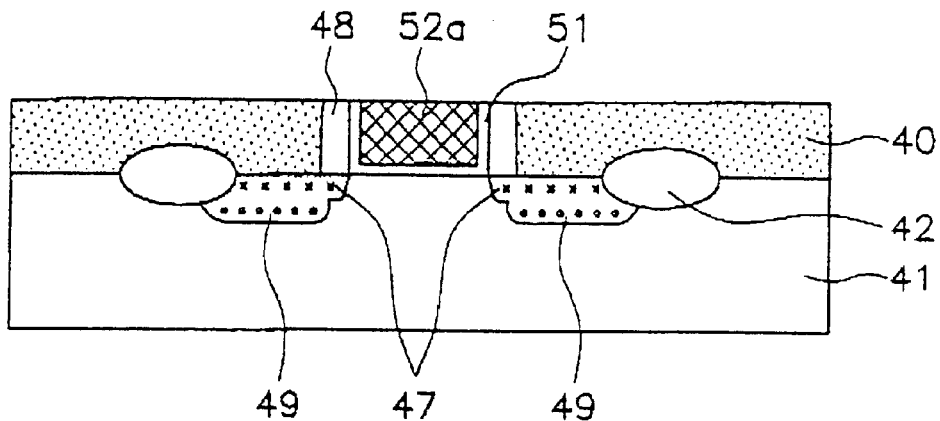

Referring to FIG. 4F, the tungsten film 52 and the gate insulating film 51 are polished in accordance with a CMP process until the interlayer insulating film 50 is exposed, thereby forming a tungsten gate 52a within the groove. As a result, a MOSFET device having the tungsten gate 52a is obtained.

Figure 4G:
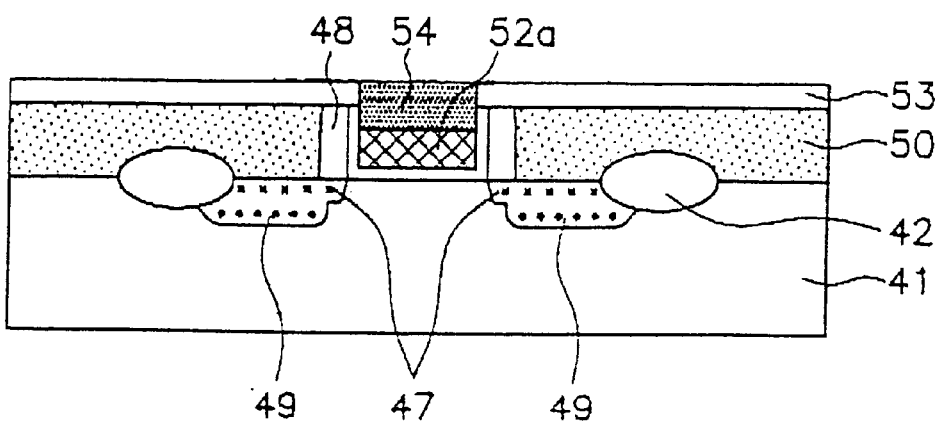

Referring to FIG. 4G, a second polysilicon film 53 is deposited to a thickness of 100 to 300 Å over the resultant substrate and then the resultant substrate is subjected to furnace annealing for 10 to 30 minutes in an atmosphere containing $N_2$ and at the temperature of 600 to 800° C. During the annealing process, a reaction occurs between the silicon of the second polysilicon film 53 and the tungsten of the tungsten gate 52a. As a result of the reaction, a tungsten silicide film 54 is formed self-aligned on the surface of the tungsten gate 52a. An N-type dopant such as phosphorous (P) or arsenic (As) is implanted at a dose of $1–5 \times 10^{15}$ ions/cm$^2$ and at the energy of 20–40 keV into the tungsten silicide film 54. Here, rapid thermal annealing (RTA) may be carried out for 10–30 seconds in an atmosphere containing $N_2$ and at the temperature of 700–900° C. instead of the furnace annealing process.

Figure 4H:
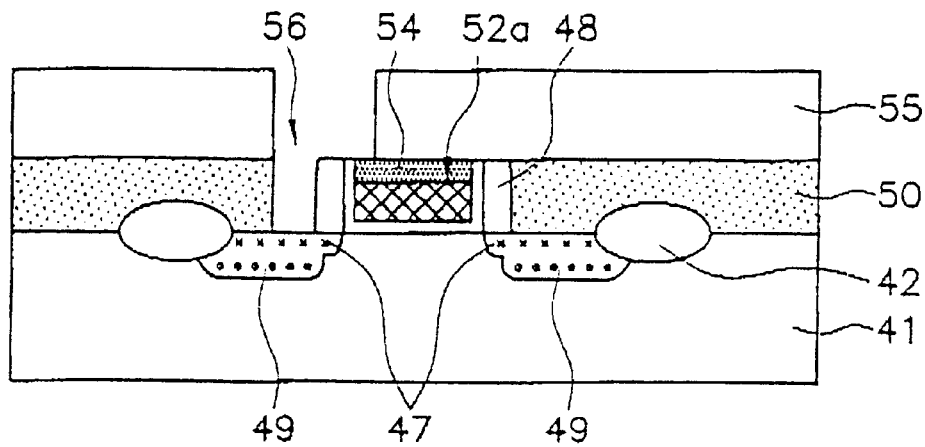

Referring to FIG. 4H, the second polysilicon film 53 and the tungsten silicide film 54 are polished in accordance with a CMP process using the first interlayer insulating film 50 as a polishing stop layer. Here, the tungsten silicide film 54 may be doped after being polished, as opposed to after being formed. The second interlayer insulating film 55 is formed over the semiconductor substrate 41. Predetermined parts of the second interlayer insulating film 55 and the first interlayer insulating film 50 are selectively etched in accordance with a well-known photolithography process to form a contact hole 56. The contact hole 56 exposes source/drain regions 49. As shown, a part of the tungsten silicide film 54 may be exposed due to the misalignment of the light exposure mask used during the photolithography process.

Figure 4I:
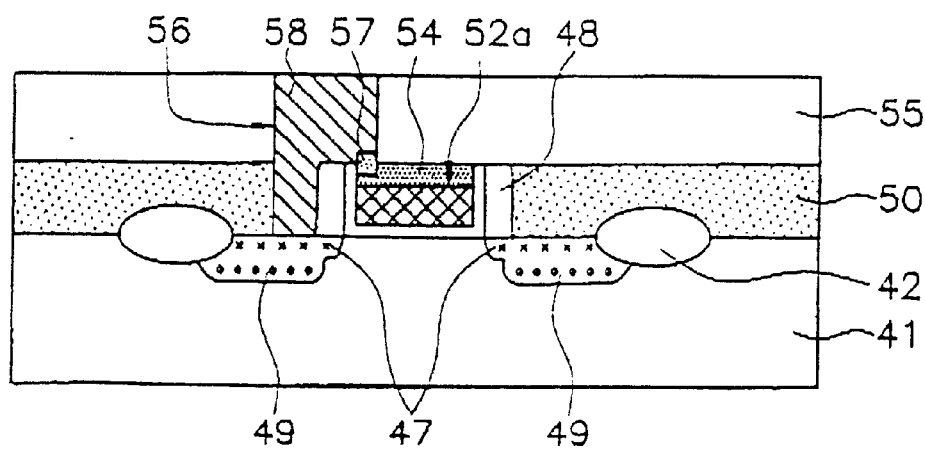

Referring to FIG. 4I, the exposed parts of the tungsten silicide film 54 are oxidized, thereby forming a silicon oxide film (SiO$_2$) 57. In accordance with the oxidation process, furnace annealing and thermal oxidation are successively carried out. Here, the furnace annealing is carried out for 30 to 60 seconds in an atmosphere containing $N_2$ and at the temperature of 800 to 900° C. The thermal oxidation is carried out at the temperature of 700 to 800° C. until a silicon oxide film 57 having a thickness of 100 to 300 Å is formed. A conductive film, for example, polysilicon film, is deposited over the second interlayer insulating film 55 to completely fill the contact hole 56, and then a contact plug 57 is formed by polishing the conductive film and using the second interlayer insulating film 55 as a polishing stop layer.

As a result, a MOSFET device according to the present invention is obtained.

In accordance with the present invention, an electrical short between the tungsten gate 52a and the contact plug 57 is prevented by the silicon oxide film 57. The silicon oxide film 57 is used for an electrical insulator because of its superior electrical insulation property. Moreover, active research efforts have been made in association with the reaction mechanism and the properties of the silicon oxide film. Accordingly, where a silicon oxide film is interposed between the tungsten gate and contact plug, electrical insulation is obtained by the silicon oxide film.

An oxide obtained as a result of oxidizing tungsten silicide is generally a mixture of tungsten oxide and silicon oxide. As a result, despite efforts to obtain a pure silicon oxide, there is necessarily a minimum amount of tungsten oxide within the silicon oxide obtained as a result of oxidation for tungsten silicide. However, the minimum amount of tungsten oxide has no effect on the electrical insulating property, and provides an etch selectivity as compared to pure silicon oxide.

Therefore, although not described above, where pure silicon oxide grown during an oxidation process on the silicon substrate is removed by a wet etching, a silicon oxide film obtained by oxidation for the tungsten suicide is not removed due to the fact that it has an etch selectivity with respect to pure silicon oxide. As a result, the silicon oxide obtained by oxidation of the tungsten silicide may be advantageously used as an electrical insulator.

Consequently, the method for fabricating a MOSFET device in accordance with the present invention prevents an electrical short between a tungsten gate and a contact plug by using a silicon oxide film having a superior electrical insulation property. Accordingly, the method of the present invention can be applied to SAC process after formation of tungsten gate and improvement of device characteristics can be expected. Moreover, it can be advantageously applied to the manufacture of highly integrated devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MOSFET device comprising the steps of:

forming a sacrificial gate on an active region of a silicon substrate;

forming a source/drain region on the active regions of the silicon substrate at sides of the sacrificial gate;

forming a first interlayer insulating film on the silicon substrate while exposing the sacrificial gate;

removing the exposed sacrificial gate to form a groove;

forming a gate insulating film and a tungsten film over the silicon substrate;

polishing the tungsten film and the gate insulating film to form a tungsten gate in the groove;

forming a polysilicon film over the resultant substrate including the tungsten gate;

forming a tungsten silicide film self-aligned at an interface between the polysilicon film and the tungsten gate;

polishing the polysilicon film and the tungsten silicide to expose the first interlayer insulating film;

forming a second interlayer insulating film over the silicon substrate;

forming a contact hole exposing the source/drain region by etching a predetermined parts of the first and second interlayer insulating films;

conducting of oxidization process such that if a portion of the tungsten silicide film is exposed, a silicon oxide film is formed on the exposed portion; and forming a contact plug within the contact hole.

2. The method according to claim 1, wherein the polysilicon film is deposited to a thickness of 100 to 300 Å.

3. The method according to claim 1, wherein the tungsten silicide film is formed by a furnace annealing process, which is carried out for 10 to 30 minutes in an atmosphere containing N at a temperature of 600 to 800° C.

4. The method according to claim 1, wherein the tungsten silicide film is formed by a rapid thermal annealing (RTA) process for 10 to 30 seconds in an atmosphere containing N at a temperature of 700 to 900° C.

5. The method according to claim 1, further comprising:

implanting an n type dopant at a dose of $1\sim5\times10^{15}$ ions/cm$^2$ and an energy of 20 to 40 keV into the tungsten silicide film prior to the polishing step.

6. The method according to claim 1, further comprising:

implanting an n type dopant at a dose of $1\sim5\times10^{15}$ ions/cm$^2$ and an energy of 20 to 40 keV into the tungsten suicide film after the polishing step.

7. The method according to claim 1, wherein the conducting an oxidation process step includes a furnace annealing and a thermal oxidation.

8. The method according to claim 7, wherein the furnace annealing is carried out for 30 to 60 minutes in an atmosphere containing N at a temperature of 800 to 900° C.

9. The method according to claim 7, wherein the thermal oxidation is carried out at a temperature of 700 to 800° C. to form a silicon oxide film having a thickness of 100 to 300 Å.

10. The method of claim 1, further comprising:

doping the tungsten silicide film.

11. The method of claim 10, wherein the doping step is performed prior to the polishing step.

12. The method of claim 10, wherein the doping step is performed after the polishing step.

13. A method of fabrication, comprising:

forming a structure on a semiconductor substrate, the structure including a gate structure formed of a tungsten silicide film and a silicon oxide film;

forming a contact hole near the gate structure; and conducting an oxidation process such that if a portion of the tungsten silicide film is exposed by the contact hole, the silicon oxide film is formed on the exposed portion of the tungsten silicide film.

14. The method according to claim 13, wherein the conducting an oxidation process step includes a furnace annealing and a thermal oxidation.

15. The method according to claim 14, wherein the furnace annealing is carried out for 30 to 60 minutes in an atmosphere containing N at a temperature of 800 to 900° C.

16. The method according to claim 15, wherein the thermal oxidation is carried out at a temperature of 700 to 800° C. to form a silicon oxide film having a thickness of 100 to 300 Å.

* * * * *